(12) United States Patent
Lin

(10) Patent No.: US 12,341,439 B2
(45) Date of Patent: Jun. 24, 2025

(54) CONFIGURATIONAL STRUCTURE OF UNIDIRECTIONAL/BIDIRECTIONAL AC/DC POWER SUPPLY

(71) Applicant: Hong Liu Co., Ltd., Taichung (TW)

(72) Inventor: Mu-Chun Lin, Taichung (TW)

(73) Assignee: HONG LIU CO., LTD., Taichung (TW)

( * ) Notice: Subject to any disclaimer, the term of this patent is extended or adjusted under 35 U.S.C. 154(b) by 223 days.

(21) Appl. No.: 18/360,501

(22) Filed: Jul. 27, 2023

(65) Prior Publication Data

US 2025/0038652 A1 Jan. 30, 2025

(51) Int. Cl.
*H02M 7/68* (2006.01)
*H02M 3/00* (2006.01)
*H02M 7/00* (2006.01)
*H05K 7/14* (2006.01)
*H02M 1/42* (2007.01)
*H02M 1/44* (2007.01)
*H02M 7/66* (2006.01)
*H02M 7/797* (2006.01)
*H05K 5/02* (2006.01)

(52) U.S. Cl.
CPC ........... *H02M 7/003* (2013.01); *H02M 3/003* (2021.05); *H05K 7/14322* (2022.08); *H05K 7/14329* (2022.08); *H02M 1/4216* (2013.01); *H02M 1/44* (2013.01); *H02M 7/66* (2013.01); *H02M 7/68* (2013.01); *H02M 7/797* (2013.01); *H05K 5/0247* (2013.01); *H05K 7/1432* (2013.01)

(58) Field of Classification Search
CPC .... H02M 7/003; H02M 3/003; H02M 1/4216; H02M 1/44; H02M 7/66; H02M 7/68; H02M 7/79; H02M 7/797; H05K 7/14322; H05K 7/14329; H05K 5/0247; H05K 7/1432
See application file for complete search history.

(56) References Cited

U.S. PATENT DOCUMENTS

| | | | | |
|---|---|---|---|---|
| 6,198,642 B1* | 3/2001 | Kociecki | ............. | H02M 1/4225 |
| | | | | 307/155 |
| 9,466,995 B2* | 10/2016 | Groat | .................... | H02J 7/0042 |
| 2003/0133267 A1* | 7/2003 | Beihoff | ................ | B60L 15/007 |
| | | | | 361/704 |

(Continued)

*Primary Examiner* — Gary L Laxton
(74) *Attorney, Agent, or Firm* — Sinorica International Patent & Trademark

(57) ABSTRACT

A configurational structure of a unidirectional/bidirectional AC/DC power supply includes: a case, having a first lateral wall and a second lateral wall at two transverse sides thereof and defining a front wall and a back wall at two longitudinal sides thereof; a first bus unit, being installed in the case and against the first lateral wall; a power factor correction (PFC) unit, being installed in the case and close to the front wall; three power module units, being installed abreast in the case, the power module units and located between the PFC unit and the back wall; a second bus unit, being installed on the back wall; and a control system unit, being installed in the case and against the second lateral wall. Thereby, with the sophisticated configuration and layout formed among the components, the resulting power supply has reduced distortion, enhanced performance, and improved efficiency.

5 Claims, 3 Drawing Sheets

(56) References Cited

U.S. PATENT DOCUMENTS

| | | | |
|---|---|---|---|
| 2014/0160822 A1* | 6/2014 | Kuwano | B60L 15/007 363/141 |
| 2019/0098777 A1* | 3/2019 | Nakatsu | H02M 7/003 |
| 2023/0208320 A1* | 6/2023 | Sun | H01F 27/22 307/9.1 |

* cited by examiner

CONFIGURATIONAL STRUCTURE OF UNIDIRECTIONAL/BIDIRECTIONAL AC/DC POWER SUPPLY

BACKGROUND OF THE INVENTION

1. Technical Field

The present invention relates to power supplies, and more particularly to a configurational structure of a unidirectional/bidirectional AC/DC power supply.

2. Description of Related Art

An AC/DC power supply is a power supplying device with AC/DC conversion capability. The main function of such a device is to convert standard, alternating current (such as that coming from mains electricity) into constant, direct current, which is then usable to power electrical loads. Therefore, most power supplies are unidirectional power supplies.

In addition, as environmental protection and energy conservation have attracted increasing attention, bidirectional power supplies become popular as an effective solution for recovering and reusing electric energy generated by energy storage devices. A bidirectional power supply is built to not only convert AC from mains electricity into DC to power loads but also convert electricity in an energy storage device into standard DC, which is then fed into mains electricity for reuse.

FIG. 1 depicts configuration of components inside a conventional bidirectional power supply. The power supply 10 has a case 11 formed by a facade plate 111 at the front, a back plate 112 at the rear, and two wall plates 113 at two laterals of the case 11. Three power module units 12 and a control system module 13 are arranged in parallel transversely in the case 11. Each of the power module units 12 further comprises a single-phase power factor correction (PFC) unit 121, a D/D conversion unit 122, and a buck/boost conversion unit 123. A power lead 14 is arranged along one of the wall plates 113 of the case 11. Through the power lead 14, the power module units 12 are connected to the AC end and in turn connected to the mains electricity. Through another power lead 15, the power module units 12 are connected to the DC end behind the back plate 112. Thereby, the bidirectional power supply is able to supply bidirectional AC/DC electricity.

While the conventional power supply 10 and its counterparts do feature bidirectional conversion of power, the configuration and layout of components therein leave them some disadvantages:

1. Since a bidirectional power supply 10 in use is mounted on a rack that is then arranged in parallel transversely with other racks, the conventional configuration where the power module units 12 are arranged in parallel transversely is particularly adverse to heat dissipation.
2. With each of the power module unit 12 being equipped with a dedicated single-phase PFC unit 121, the manufacturing costs and the resulting volume of the overall bidirectional power supply 10 are both high, and the packed interior of the case 11 is also adverse to heat dissipation.
3. In the known bidirectional power supply, the power leads 14, 15 leading to the AC end and the DC end are used for power transmission. As the power leads 14, 15 takes considerable room in the case 11, their presence prevents the bidirectional power supply 10 from being made smaller.

In view of this, the inventor of the present invention has used years of experience and expertise in the art to improve the conventional devices and devise the subject matter of the present invention.

SUMMARY OF THE INVENTION

The primary objective of the present invention is to provide a configurational structure of a unidirectional/bidirectional AC/DC power supply, with the sophisticated configuration and layout formed among the components, the resulting power supply has reduced distortion, enhanced performance, and improved efficiency.

To achieve the foregoing objective, the disclosed configurational structure of the unidirectional/bidirectional AC/DC power supply comprises: a case, being rectangular, defining therein an accommodating space, and defining a first direction and a second direction, the case having a first lateral wall and a second lateral wall extending in the first direction at two laterals thereof, and having a front wall and a back wall extending in the second direction at a front and aback thereof; a first bus unit, being installed in the case so as to extend in the first direction and be against the first lateral wall, and having one end extending to an outside of the back wall; a power factor correction (PFC) unit, being installed in the case so as to extend in the second direction and be close to the front wall, wherein the PFC unit is a three-phase three-level power factor correction circuit; three power module units, being installed in the case so as to extend in the first direction and be in parallel to each other, and being located between the PFC unit and the back wall; a second bus unit, being installed on the back wall so as to extend in the second direction, and extending to the outside of the back wall; and a control system unit, being installed in the case so as to extend in the first direction and be against the second lateral wall.

DETAILED DESCRIPTION OF THE INVENTION

Figure 1:
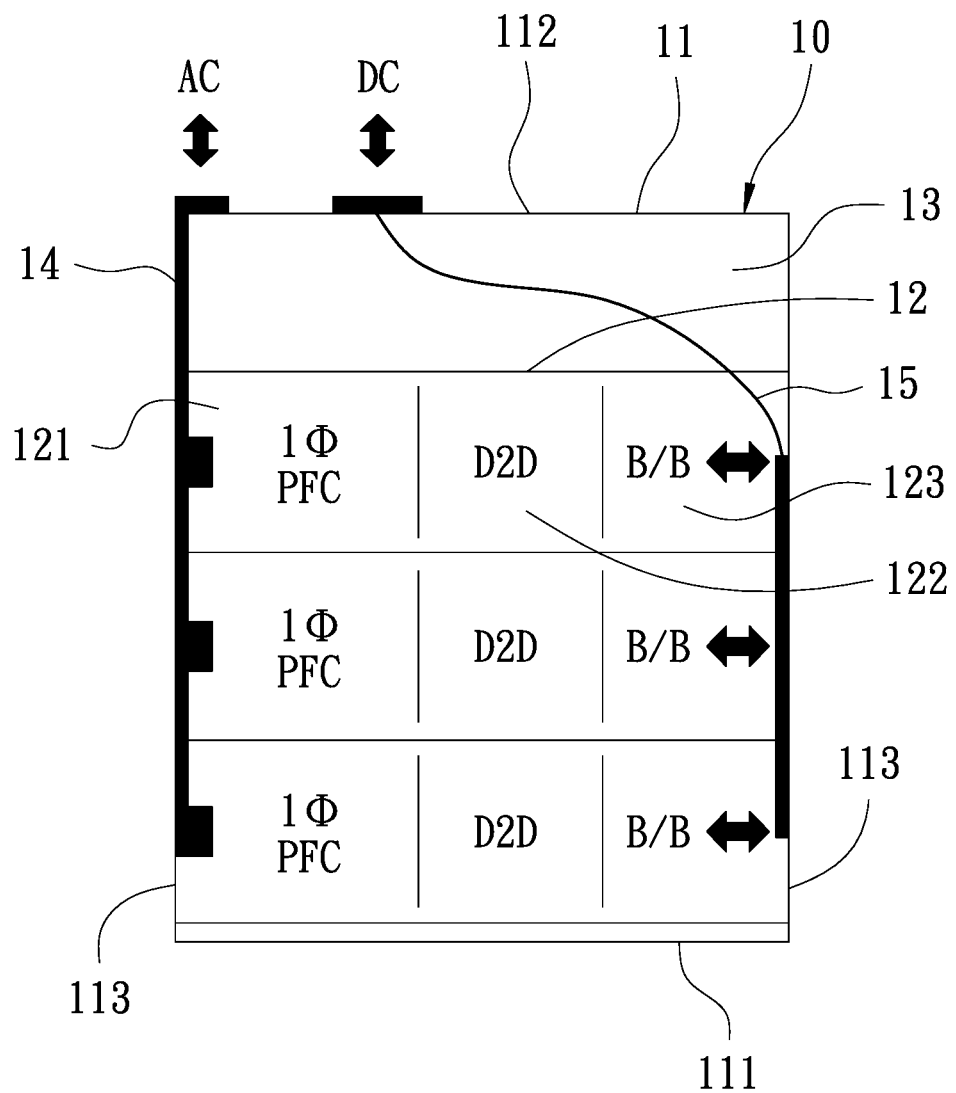
FIG. 1 is a configuration diagram of components in a conventional bidirectional power supply.
Figure 2:
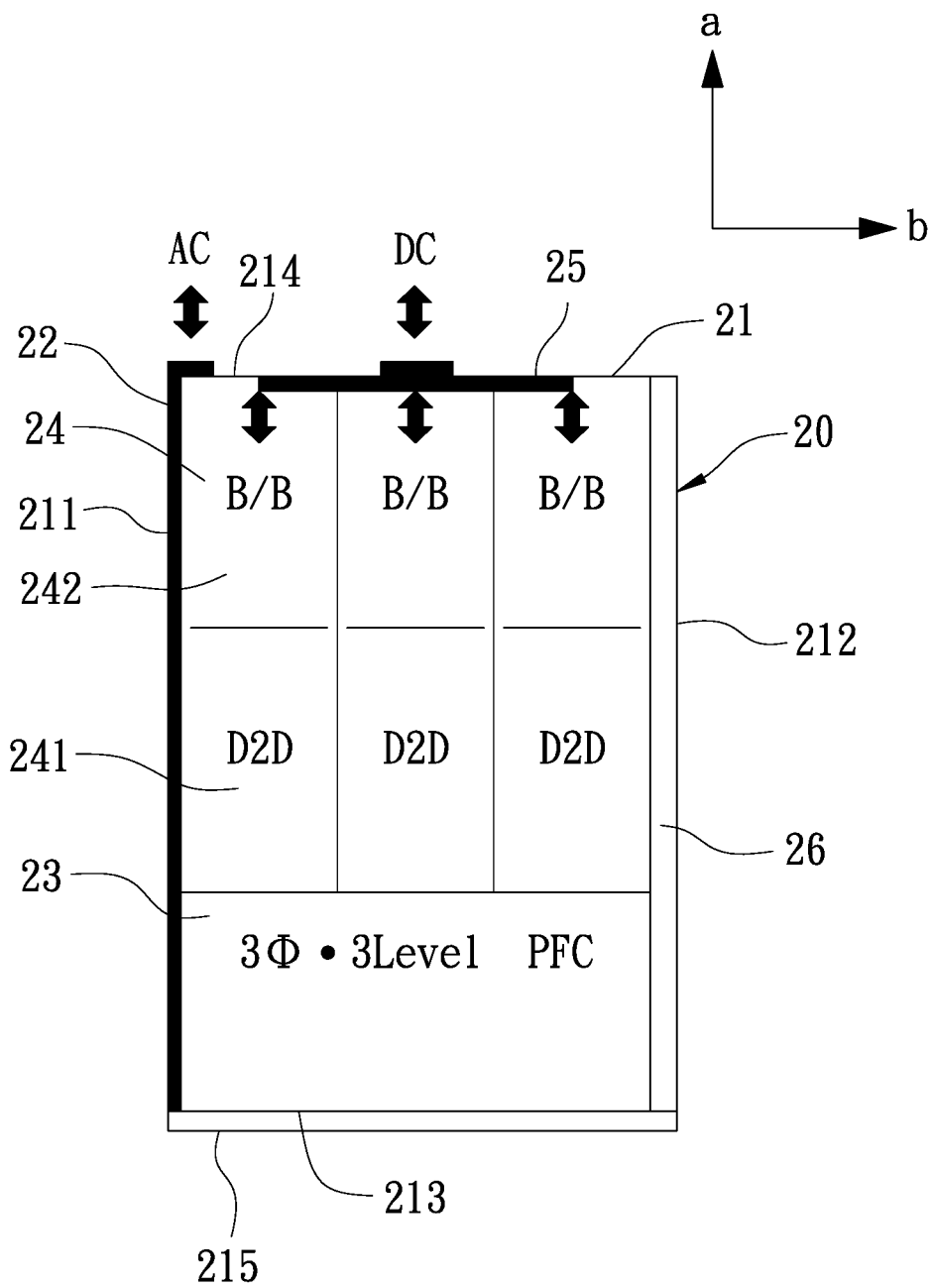
FIG. 2 is a configuration diagram according to a preferred embodiment of the present invention.

FIG. 2 depicts a configurational structure of a unidirectional/bidirectional AC/DC power supply according to one preferred embodiment of the present invention. The power supply 20 comprises the following components.

A case 21 is rectangular in shape. The case 21 defines therein an accommodating space, and defines a first direction a and a second direction b. The case 21 has a first lateral wall 211 and a second lateral wall 212 extending in the first direction a at its left and right, and has a front wall 213 and a back wall 214 extending in the second direction b at its front and back. An operable display unit 215 is attached to the outer side of the front wall 213, and vents for heat dissipation are formed on each of the front wall 213 and the back wall 214 of the case 21.

A first bus unit 22 is made of an electrically conductive metal sheet. The first bus unit 22 is such installed in the case 21 that it extends in the first direction and is located against the first lateral wall 211. The first bus unit 22 has its one end extending beyond the back wall 214 for connection with AC mains electricity.

A power factor correction (PFC) unit 23 is electrically connected to the first bus unit 22. The PFC unit 23 is such installed in the case 21 that it extends in the second direction b configuration and is located close to the front wall 213. The PFC unit 23 is a three-phase three-level (3Φ 3Level) power factor correction circuit.

Three power module units 24 are electrically connected to the PFC unit 23. They are such installed the case 21 that they each extend in the first direction a and are in parallel to each other. The power module units 24 are located between the PFC unit 23 and the back wall 214. Each of the power module unit 24 further comprise a D2D conversion unit 241 and a buck/boost conversion unit 242.

A second bus unit 25, similar to the first bus unit 22, is made of an electrically conductive metal sheet. The second bus unit 25 has its one end electrically connected to the PFC unit 23 while its opposite end is arranged on the back wall 214 in the second direction b and extended to the outside of the back wall 214 to be connected to an external load or energy storage device.

A control system unit 26 is electrically connected to the PFC unit 23 and the power module units 24, and is such installed in the case 21 that it extends in the first direction and against the second lateral wall 212.

To further explain the structural features, technical means, and expected benefits of the present invention, the following description will be directed to the use of the present invention for a reader to have better understanding to the present invention In the present invention, when the first bus unit 22 has its one end connected to three-phase AC mains electricity, the incoming three-phase AC voltage is converted by the three-phase three-level PFC unit 23 into DC voltage, which is then transformed by the power module units 24 in parallel connection into desired DC voltage. The transformed voltage is output by the second bus unit 25 to serve as a DC source and power a load. Since the disclosed power supply works bidirectionally, when the second bus unit 25 is connected to a power storage device, the power supply 20 also serves to send the DC power generated by the power storage device back to the power module units 24 through the second bus unit 25. The incoming power is transformed by the power module units 24 into desired DC voltage and converted by the PFC unit 23 into three-phase AC voltage, before being fed into mains electricity by the first bus unit 22. As such, the present invention supports not only AC-to-DC conversion for power use, but also DC-to-AC conversion for power generation, thereby accomplishing supplying AC/DC power unidirectionally/bidirectionally.

Since the three power module units 24 in the disclosed power supply are each placed in the front-to-back direction, the gaps therebetween are directly open to the vents provided on the front wall 213 and the back wall 214, thereby improving heat dissipation for the power module units 24. In addition, the present invention is composed of a three-phase three-level PFC unit 23 and three power module units 24, so the resulting power supply has reduced distortion, enhanced performance, and improved efficiency.

Additionally, the disclosed configurational structure can be used instead of conventional power leads to flatten the structure for power transmission, thereby saving space conventionally occupied by power leads and allowing the accommodating space and in turn the overall resulting power supply to be made small and compact.

Figure 3:
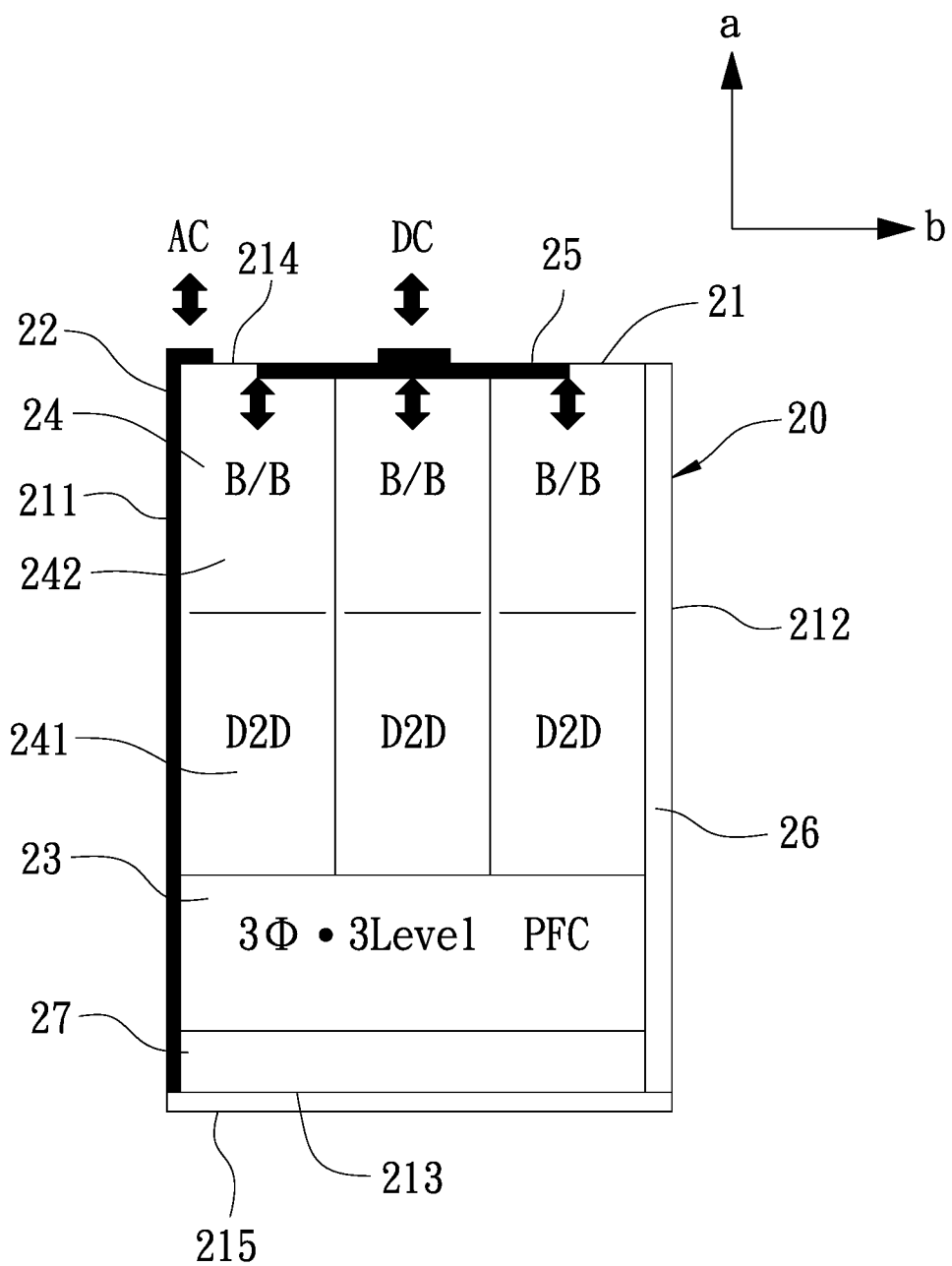
FIG. 3 is a configuration diagram according to another preferred embodiment of the present invention.

Referring further to FIG. 3, in another preferred embodiment of a configurational structure of a unidirectional/bidirectional AC/DC power supply according to the present invention, the power supply 20 further comprises an electromagnetic interference (EMI) filtering unit 27, which is arranged between the PFC unit 23 and the front wall 213. The EMI filtering unit 27 serves to suppress EMI generated by the power supply 20.

To sum up, the present invention shows great inventive steps in its class and no disclosure of identical structures has not been seen in any technical materials and literatures related to this art. For these reasons, the present invention is worthy to be patented and thus the application is filed according to law.

The present invention has been described with reference to the preferred embodiments and it is understood that the embodiments are not intended to limit the scope of the present invention. Moreover, as the contents disclosed herein should be readily understood and can be implemented by a person skilled in the art, all equivalent changes or modifications which do not depart from the concept of the present invention should be encompassed by the appended claims.

What is claimed is:

1. A configurational structure of a unidirectional/bidirectional AC/DC power supply, comprising:
   a case, being rectangular, containing therein an accommodating space, defining a first direction and a second direction, having a first lateral wall and a second lateral wall extending in the first direction at two laterals thereof, and having a front wall and a back wall extending in the second direction at a front and a back thereof;
   a first bus unit, being installed in the case so as to extend in the first direction and be against the first lateral wall, and having one end extending to an outside of the back wall;
   a power factor correction (PFC) unit, being installed in the case so as to extend in the second direction and be close to the front wall, and being electrically connected to the first bus unit, wherein the PFC unit is a three-phase three-level power factor correction circuit;
   three power module units, being installed in the case so as to extend in the first direction and be in parallel to each other, being located between the PFC unit and the back wall, and being electrically connected to the PFC unit;
   a second bus unit, being installed on the back wall so as to extend in the second direction, having one end electrically connected to the power module units, and having an opposite end extending to the outside of the back wall; and
   a control system unit, being installed in the case so as to extend in the first direction and be against the second lateral wall, and being electrically connected to the PFC unit and the power module units.

2. The configurational structure of the unidirectional/bidirectional AC/DC power supply of claim 1, wherein each of the power module units further comprises a D2D conversion unit and a buck/boost conversion unit.

3. The configurational structure of the unidirectional/bidirectional AC/DC power supply of claim 1, further comprising an electromagnetic interference (EMI) filtering unit, which is arranged between the PFC unit and the front wall.

4. The configurational structure of the unidirectional/bidirectional AC/DC power supply of claim 1, further comprising an operable display unit, which is installed on an outside of the front wall.

5. The configurational structure of the unidirectional/bidirectional AC/DC power supply of claim 1, wherein the first bus unit and the second bus unit are both made of electrically-conductive metal sheets.

* * * * *